(12) United States Patent
Cai et al.

(10) Patent No.: US 8,570,693 B2
(45) Date of Patent: Oct. 29, 2013

(54) COMPENSATING FOR AN ELECTROSTATIC DISCHARGE CAPACITANCE LOAD

(75) Inventors: Xing Jian Cai, San Jose, CA (US); Ke W. Wang, Laveen, AZ (US); Neffody E. Kraskoff, Hillsboro, OR (US); Wei Z. Gao, Lafayette, CA (US); Michael J. Castillo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 371 days.

(21) Appl. No.: 12/758,587

(22) Filed: Apr. 12, 2010

(65) Prior Publication Data

US 2011/0248789 A1    Oct. 13, 2011

(51) Int. Cl.
*H02H 9/00*   (2006.01)
*H02H 3/22*   (2006.01)
*H04B 1/38*   (2006.01)
*H01L 23/62*  (2006.01)

(52) U.S. Cl.
USPC ............. 361/56; 361/111; 375/219; 257/355

(58) Field of Classification Search
USPC ..................... 361/56, 111; 375/219
See application file for complete search history.

(56) References Cited

U.S. PATENT DOCUMENTS

| | | | |
|---|---|---|---|
| 7,433,167 B2 * | 10/2008 | Schediwy et al. | 361/112 |
| 7,463,112 B1 * | 12/2008 | Groves | 333/33 |
| 7,479,680 B2 * | 1/2009 | Dunnihoo et al. | 257/355 |
| 2010/0232480 A1 * | 9/2010 | Bhandal et al. | 375/219 |

\* cited by examiner

*Primary Examiner* — Jared Fureman
*Assistant Examiner* — Lucy Thomas
(74) *Attorney, Agent, or Firm* — International IP Law Group, P.L.L.C.

(57) ABSTRACT

In some embodiments a differential communication channel compensates for electrostatic discharge capacitance of an electrostatic discharge component by increasing an impedance of the differential communication channel near the electrostatic discharge component. Other embodiments are described and claimed.

13 Claims, 9 Drawing Sheets

COMPENSATING FOR AN ELECTROSTATIC DISCHARGE CAPACITANCE LOAD

TECHNICAL FIELD

The inventions generally relate to compensating for an electrostatic discharge capacitance load.

BACKGROUND

In modern communication implementations, high speed digital video systems approach a data rate of several gigabits per second (Gbps) for interface technologies such as HDMI (High Definition Multimedia Interface), DisplayPort, FireWire IEEE 1394, USB3.0 (Universal Serial Bus 3.0), etc. Due to the reduced component size and the resultant decreased span ESD (electrostatic discharge) jumps, system level ESD protection must be added on the board to pass ESD requirements set forth by the International Electomechanical Commission (IEC) in IEC 61000-4-2. Level 4 (±15 kV air, ±8 kV contact).

The on-board ESD protection component inevitably introduces some parasitic, particularly for a typically big capacitance of around 2.0 pF. This leads to a big variation of the channel impedance locally away from a nominal differential channel impedance (for example, of 100 ohms). As a result, such a high speed digital video system violates the required compliance specifications at the desired data rate due to degradation of the signal edge rate and an increase in the jitter.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Figure 1:
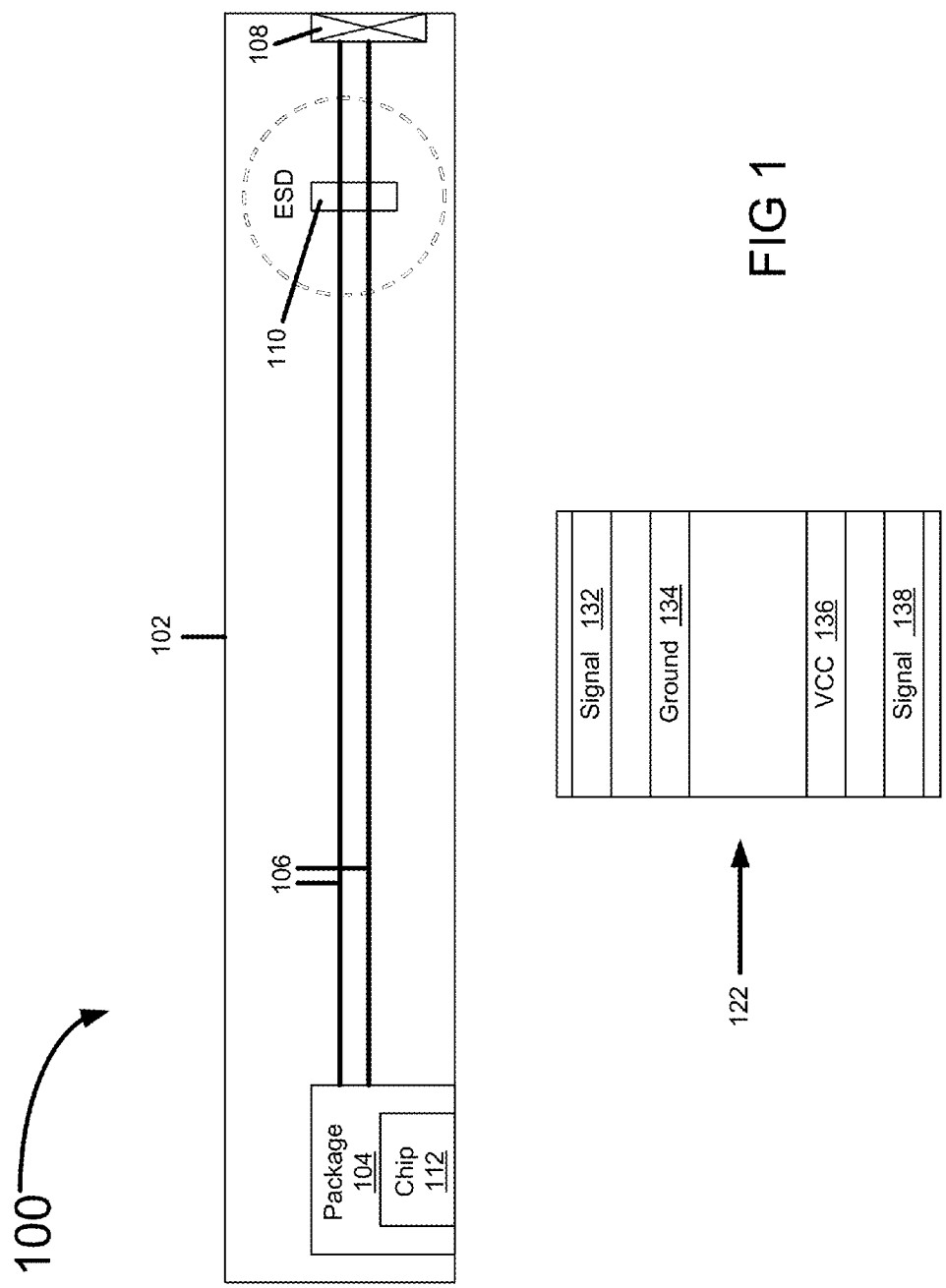
FIG. 1 illustrates a system according to some embodiments of the inventions.

Some embodiments of the inventions relate to compensating for an electrostatic discharge (ESD) capacitance load. In some embodiments, the inventions relate to compensating for an electrostatic discharge capacitance load in a high speed signal channel (for example, in some embodiments in a multi gigabits per second or multi Gbps high speed signal channel).

In some embodiments a differential communication channel compensates for electrostatic discharge capacitance of an electrostatic discharge component by increasing an impedance of the differential communication channel near the electrostatic discharge component.

In some embodiments an electrostatic discharge capacitance of an electrostatic discharge component is compensated for by increasing an impedance of a differential communication channel near the electrostatic discharge component.

There is no good system currently available that mitigates the impact of ESD parasitic capacitance and significantly improves the performance of a high speed digital video system, even after adding extra cost for a relatively low parasitic capacitance ESD component.

According to some embodiments, a high speed differential channel structure is implemented around an ESD component. The structure compensates and mitigates the impact of ESD parasitic capacitance, and significantly improves the performance of the high speed system (for example, a high speed digital video system) without adding extra manufacturing cost but while still maintaining the ESD protection.

According to some embodiments, significantly better performance is provided for a high speed system (for example, a high speed digital video system) from a signal integrity perspective while maintaining ESD protection. According to some embodiments, no extra manufacturing cost is added. Additionally, according to some embodiments, the platform gains the opportunity to reduce the overall cost by choosing a less expensive ESD component with a relatively higher parasitic capacitance without sacrificing performance.

According to some embodiments, a significant impedance discontinuity structure is used which typically needs to be avoided in legacy high speed system channel designs. This impedance discontinuity structure is applied around an ESD component in order to compensate for ESD parasitic capacitance in order to meet the eye pattern specification. According to some embodiments, a partially trenched reference structure is used to achieve both high density routing and significantly higher differential channel impedance. Using a partially trenched reference transmission line for higher impedance has not previously been applied to a high speed channel to compensate for an extra parasitic capacitance and to dramatically improve performance. In some embodiments, high speed signaling (for example, beyond Gbps) may be implemented where traditional linking would fail.

According to some embodiments, a structure of a high speed differential channel around an ESD protection component is employed. In some embodiments the structure includes three short segments (for example, of 130 ohms, 150 ohms, and 130 ohms, respectively) in a differential impedance paired transmission line routing around two pins linking the ESD component. In some embodiments, equivalent differential channel impedance is improved (for example, from 66 ohms which violates the high speed differential channel impedance nominal requirement of 100 ohms +/−15% to a level between, for example, 110 ohms and 85 ohms).

In some embodiments, in order to achieve both high density routing and significantly higher differential channel impedance, a partially trenched reference structure is used. In some embodiments, the differential impedance near an ESD component may be controlled by the gap space of the trenching reference ground underneath the differential channel routing and/or by using a slightly increased intra-space distance (for example, increasing the differential impedance from 100 ohms to 200 ohms, for example).

In some embodiments, after applying a higher impedance compensation structure, an eye pattern at 2.25 Gbps, for example, will significantly improve (for example, from totally violating to meeting the HDMI 1.3a specification with a vertical Vmargin larger than 100 mV and a horizontal Tmargin of approximately 100 ps).

FIG. 1 illustrates a system 100 according to some embodiments. In some embodiments system 100 is a high speed digital video platform and/or a high speed digital video communication system. In some embodiments, system 100 is illustrated at view 102 and in a four layer stack-up view 122. System 100 includes a package 104, a differential channel 106 including, for example, two differential signal lines, a connector 108, and an electrostatic discharge (ESD) protection component 110. In addition, package 104 includes a chip 112 (for example, in some embodiments a System on Chip or SOC 112). In some embodiments, the four layer stack-up view 122 illustrates a signal layer 132, a ground (GND) layer 134, a voltage (VCC) layer 136, and a second signal layer 138.

In some embodiments, differential channel 106 is a single differential channel on a four-layer stack-up linking the chip 112 (for example, an SOC transmitter chip) and the connector 108, through the package 104 underneath the chip 112 and the ESD component 110 in the dotted line circle illustrated in FIG. 1 right before the connector 108.

In some embodiments, the differential channel 106 has a nominal impedance (for example, in some embodiments a nominal 100 ohm differential channel impedance). Additionally, in some embodiments, in order to compensate for the parasitic capacitance of the ESD component (for example, ESD component 110), the differential channel impedance of the routing trace segment around the ESD component (for example, around the ESD component 110) is significantly increased from the nominal impedance (for example, in some embodiments from a nominal impedance of 100 ohms to an impedance of 150 ohms around the ESD component).

In some embodiments, in order to achieve high density routing for a low cost, and in order to mitigate EMI (electromagnetic interference) noise and/or EMC (electromagnetic compatibility) noise, the nominal differential channel impedance (for example, 100 ohms) is tightly-coupled with a limit trace width that is a manufacturing limit. Assuming, for example, that the nominal signal ended trace is targeting at 55 ohms, the highest theoretically achievable differential impedance is 110 ohms with a wide intra-pair spacing between the differential signals. In some embodiments, a reference ground plane right underneath the differential channel is trenched.

Figure 2:
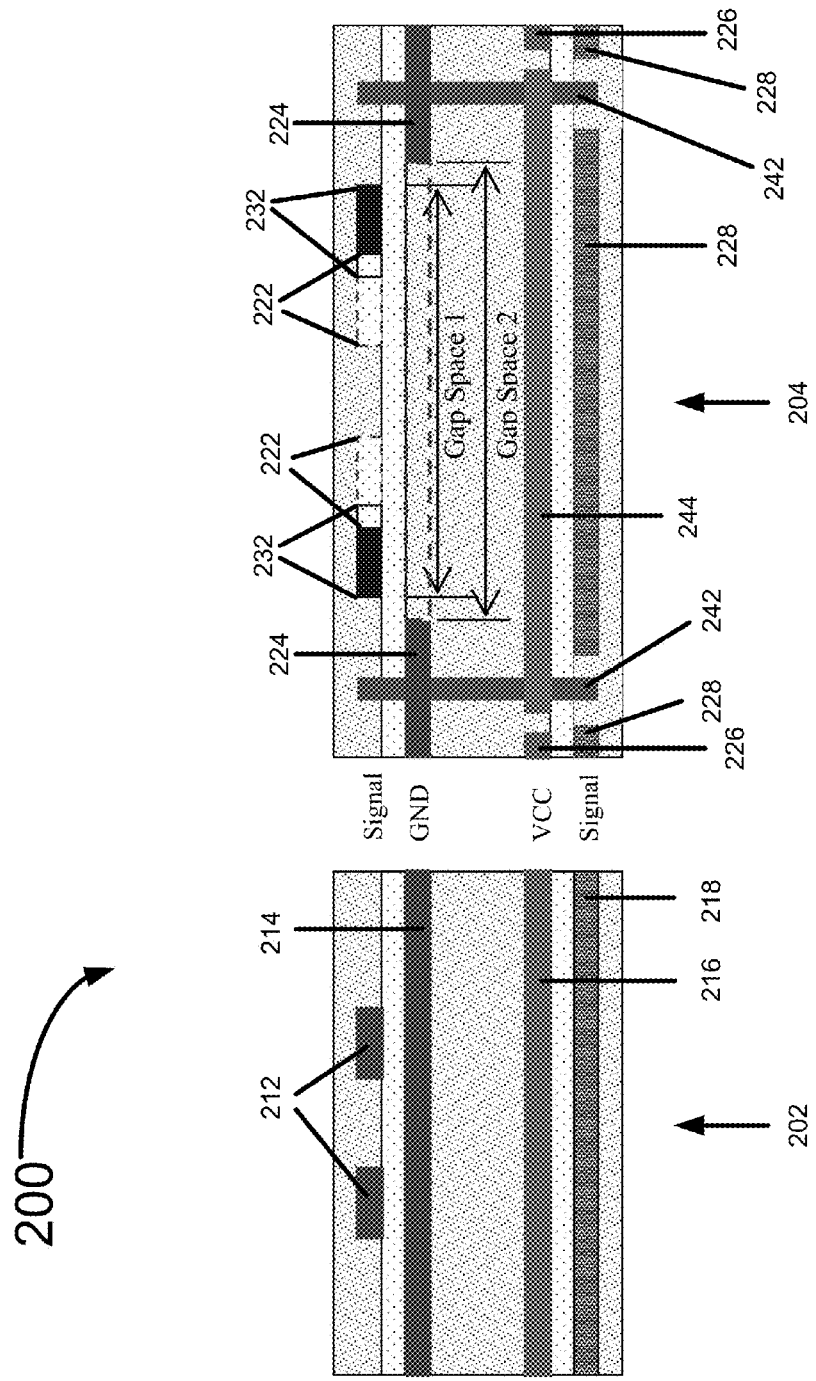
FIG. 2 illustrates a structure according to some embodiments of the inventions.

FIG. 2 illustrates cross-sections 200 of a differential channel over a four-layer stack-up. Cross-sections 200 include a cross-section 202 on the left showing a differential channel with a nominal impedance (for example, a nominal 100 ohm impedance) and a cross-section 204 on the right showing a differential channel with significantly higher than a nominal impedance (for example, significantly higher than a nominal 100 ohm impedance).

Cross-section 202 illustrates differential channel signals 212 in a signal layer, a ground (GND) signal 214 in a GND layer, a voltage signal (VCC) 216 in a VCC layer, and a signal 218 in a second signal layer. In some embodiments, cross-section 202 illustrates a cross section of one differential channel over a four layer stack-up with a nominal differential channel impedance. In some embodiments, cross section 202 is a cross section of a differential channel in an area that does not include an ESD component.

Cross-section 204 illustrates in a signal layer differential channel signals 222 (in dotted line), a ground (GND) signal 224 in a GND layer, a voltage signal (VCC) 226 in a VCC layer, and a signal 228 in a second signal layer. In addition, cross-section 204 includes a differential channel signals 232 in the signal layer. Signals 232 illustrate the differential channel signals in an area near an ESD component while signals 222 are not in an area near the ESD component (shown in dotted line only to show relative location with respect to the signals 232). As illustrated in FIG. 2, the ground signal 224 (for example, the reference ground plane) of cross-section 204 is trenched underneath the differential channel (for example, the differential channel near an ESD component that includes signals 232).

In some embodiments, cross-section 204 includes a plurality of vias 242 (for example, a first via 242 and a second via 242) coupled to the ground signal 224, and a ground patch 244 coupled between the vias 242 in order to couple the ground signal 224 from the left side of cross-section 204 to the right side of cross-section 204 in the area under the differential channel routing near the ESD component, since the ground reference signal has been trenched in that area. In some embodiments, the intra-pair space between the differential pair signals 232 is increased (for example, increased slightly) in the area near the ESD component relative to the intra-pair space between the differential pair signals 222 in areas that are not near the ESD component.

According to some embodiments, in order to achieve high density routing and significantly higher differential channel impedance, the partially trenched reference structure illustrated in cross-section 204 of FIG. 2 is implemented. In this structure, the differential impedance is controlled by the gap space 1 and/or gap space 2 of the trenching ground reference plane 224 underneath the differential channel routing 232. This allows an increase in the differential channel impedance near the ESD component from the nominal impedance. For example, in some embodiments, the nominal impedance of the differential channel is 100 ohms in the area not near the ESD component (for example, as illustrated in cross-section 202 of FIG. 2), and is increased from the nominal 100 ohm impedance to a higher impedance in the area near the ESD component (for example, as illustrated in cross-section 204 of FIG. 2). In some embodiments, the impedance of the differential channel in the area near the ESD component is increased to 200 ohms, for example.

In some embodiments, the impedance of a differential channel is increased near the ESD component by trenching a reference ground layer underneath the differential channel routing, for example. In some embodiments, the impedance of a differential channel is increased near the ESD component by increasing (for example, slightly increasing) the original intra-space of the differential channel, for example. In some embodiments, the impedance of a differential channel is increased near the ESD component by trenching a reference ground layer underneath the differential channel routing and also increasing (for example, slightly increasing) the original intra-space of the differential channel, for example.

According to some embodiments, a novel structure of a high-speed differential channel is included near an electrostatic discharge (ESD) component. For example, in some embodiments, three short segments are included near a differential impedance paired transmission line routing around two pins linking an ESD component. For example, in some embodiments, the three short segments have an impedance of 130 ohms, 150 ohms, and 130 ohms. In such embodiments, for example, the equivalent differential channel impedance is improved from approximately 66 ohms, which violates a high-speed differential channel impedance requirement of nominally 100 ohms within +/−15%, to between 110 ohms and 85 ohms.

In some embodiments, in order to achieve both high density routing and significantly higher differential channel impedance, a partially trenched reference structure is used in which the differential impedance is controlled by a gap space of the trenching reference ground underneath the differential channel routing. For example, in some embodiments, this differential impedance is controlled from a nominal 100 ohms to up to 200 ohms. In some embodiments, the original routing intra-space between the differential signal lines is slightly increased in an area near an ESD component. In some embodiments, the partially trenched reference structure is used and the intra-space is slightly increased.

Figure 7:
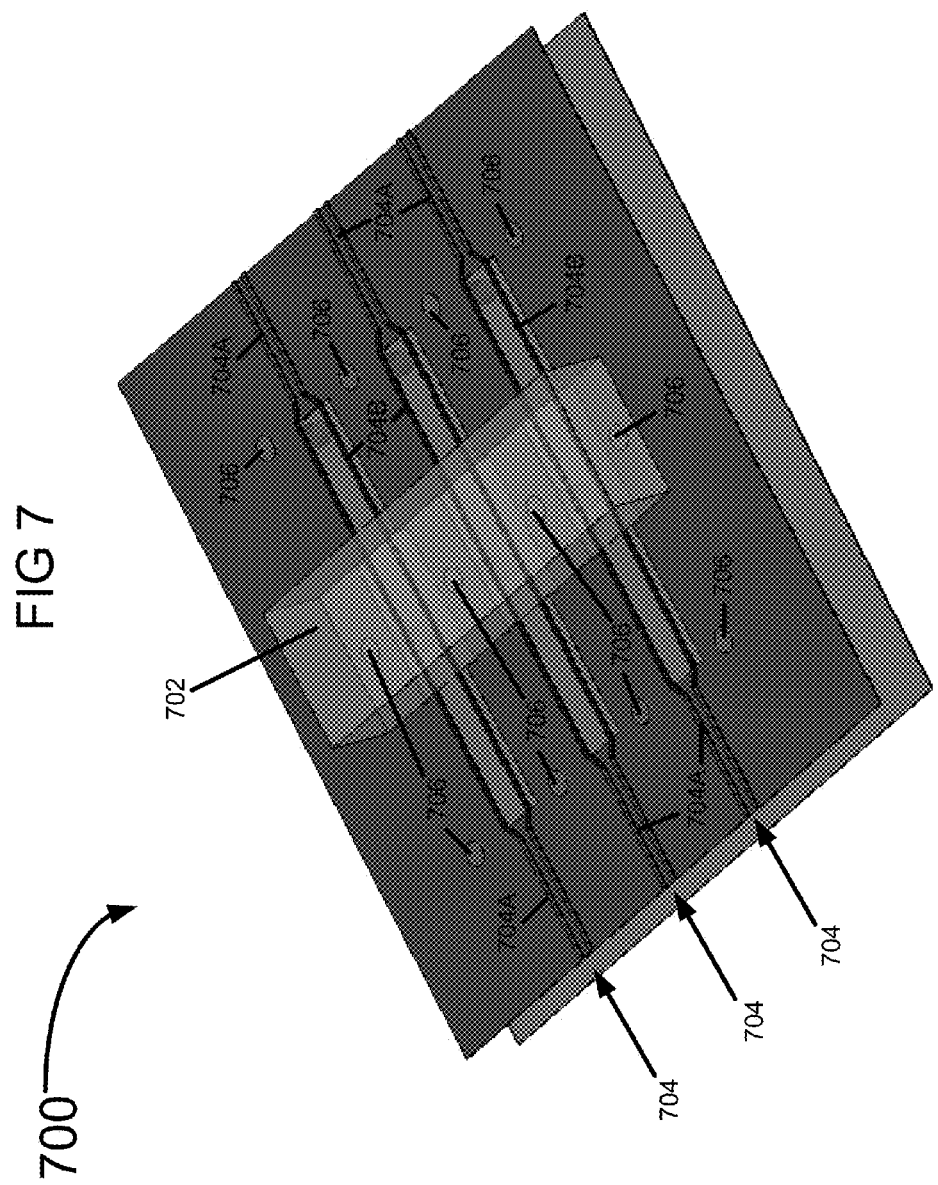
FIG. 7 illustrates a three dimensional view of a structure according to some embodiments of the inventions.
Figure 8:
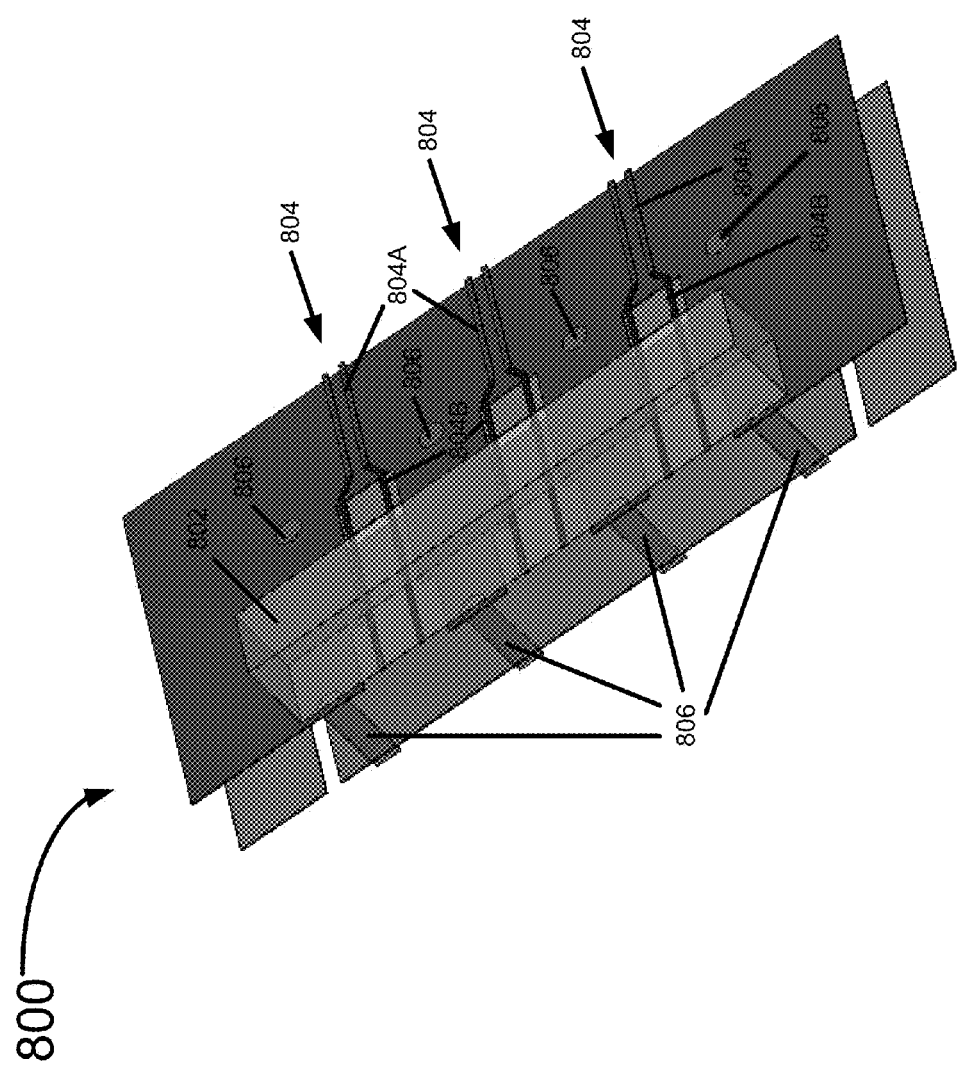
FIG. 8 illustrates a three dimensional cutaway view of a structure according to some embodiments of the inventions.

FIG. 3, FIG. 4, FIG. 5 and FIG. 6 illustrate a high impedance structure segment with an electrostatic discharge (ESD) component for three different channels according to some embodiments. FIG. 7 and FIG. 8 illustrate the high impedance structure segment with the ESD component in three dimensional views according to some embodiments.

Figure 3:
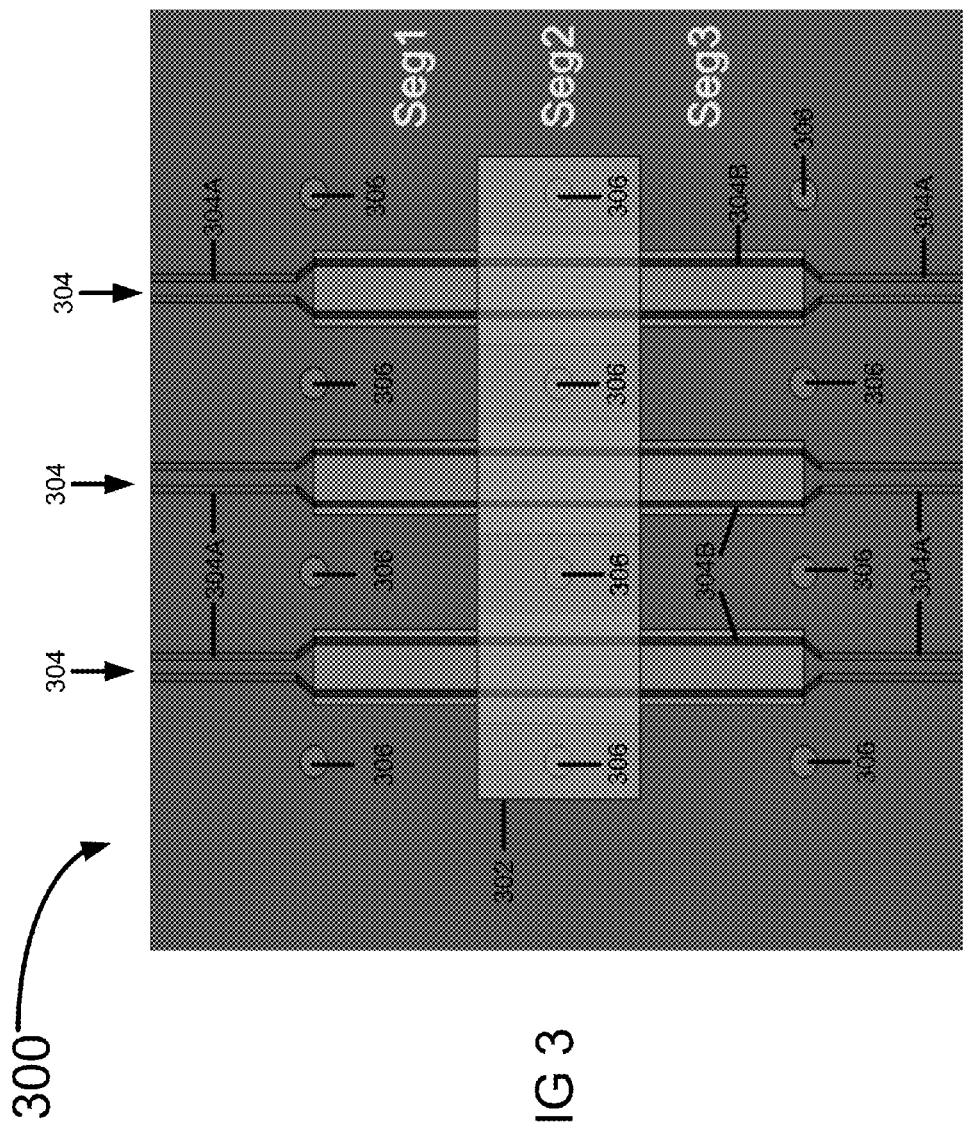
FIG. 3 illustrates a top view of a structure according to some embodiments of the inventions.

FIG. 3 illustrates a top view of a high impedance structure segment 300. High impedance structure segment 300 illustrates an electrostatic discharge (ESD) component 302 for three different differential signal channels 304 according to some embodiments. As illustrated in FIG. 3 each of the three differential signal channels 304 include in some embodiments an original intra-space 304A near the top and bottom and a slightly increased intra-space 304B near the ESD component 302. FIG. 3 also illustrates a plurality of vias 306 that may be used to couple ground signals in an area near the ESD component 302 in a manner that is the same as and/or similar to that of vias 242 of FIG. 2. Although some of the vias 306 illustrated in FIG. 3 are underneath the ESD component 302 they are illustrated in FIG. 3.

In some embodiments, the structure segment 300 includes three short segments (illustrated as Seg1, Seg2 and Seg 3 in FIG. 3). In some embodiments, Seg 1 has an impedance of 130 ohms, Seg 2 has an impedance of 150 ohms, and Seg 3 has an impedance of 130 ohms for each of the three differential impedance paired transmission line routings near the ESD component 302. In some embodiments, the equivalent differential channel impedance near the ESD component is thus improved from approximately 66 ohms (which violates the high-speed differential channel impedance of a nominal 100 ohms with +/−15%) to an impedance between 85 ohms and 110 ohms, for example.

According to some embodiments of FIG. 3, a partially trenched structure is used to achieve both high density routing and significantly higher differential channel impedance. In some embodiments, the differential impedance is controlled by the gap space of the trenching reference ground underneath the differential channel routing (for example, from a nominal impedance of 100 ohms up to an impedance of 200 ohms), either used alone or together with slightly increasing the original intra-space of the routing lines.

Figure 4:
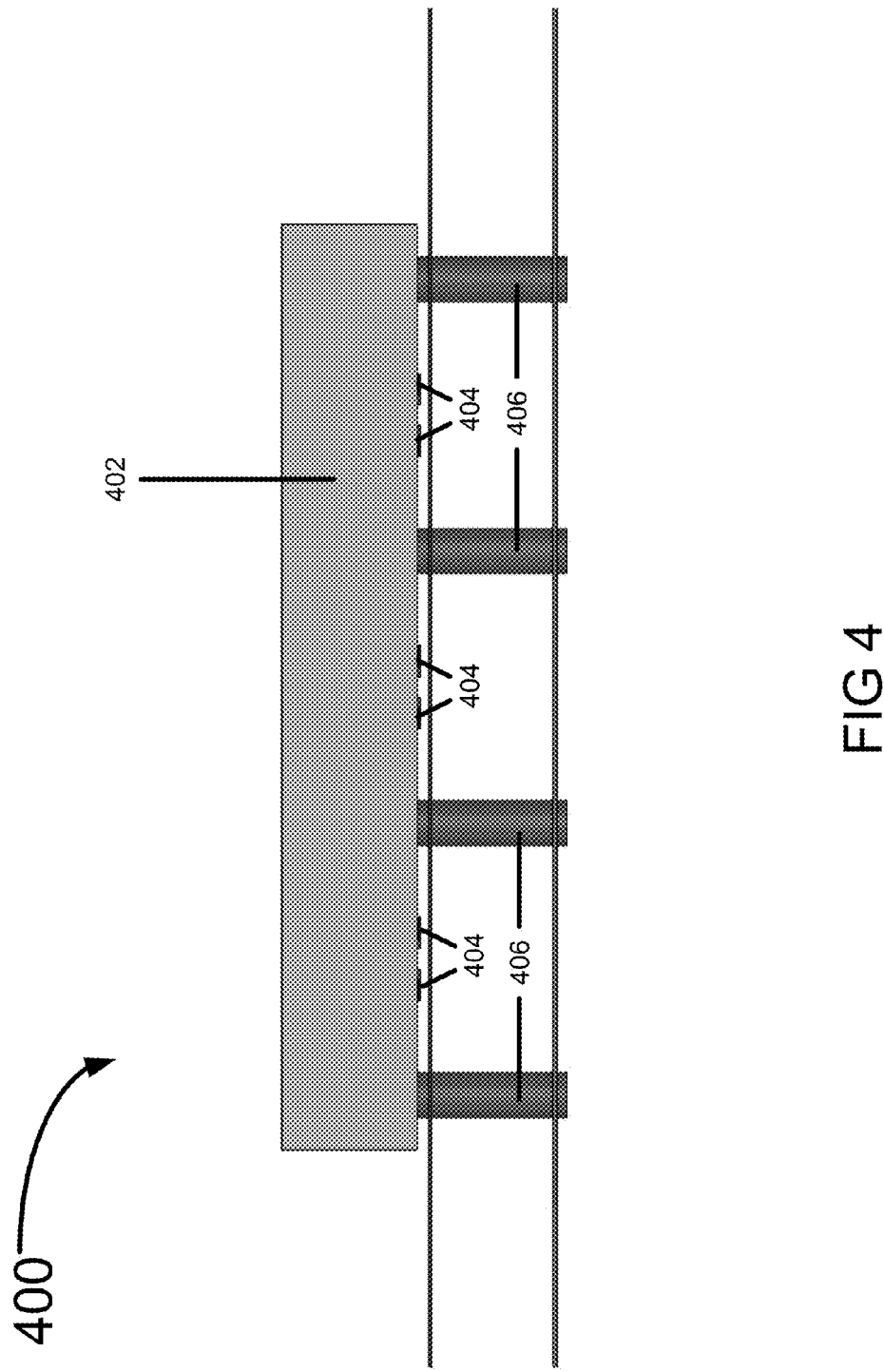
FIG. 4 illustrates a front view of a structure according to some embodiments of the inventions.

FIG. 4 illustrates a front view of a high impedance structure segment 400. In some embodiments, structure segment 400 is the same as or similar to structure segment 300 of FIG. 3. High impedance structure segment 400 illustrates an electrostatic discharge (ESD) component 402 for three different differential signal channels 404 according to some embodiments. As illustrated in FIG. 4, structure segment 400 also illustrates a plurality of vias 406 that may be used to couple ground signals in an area near the ESD component 402 in a manner that is the same as and/or similar to that of vias 242 of FIG. 2 and/or vias 306 of FIG. 3.

Figure 5:
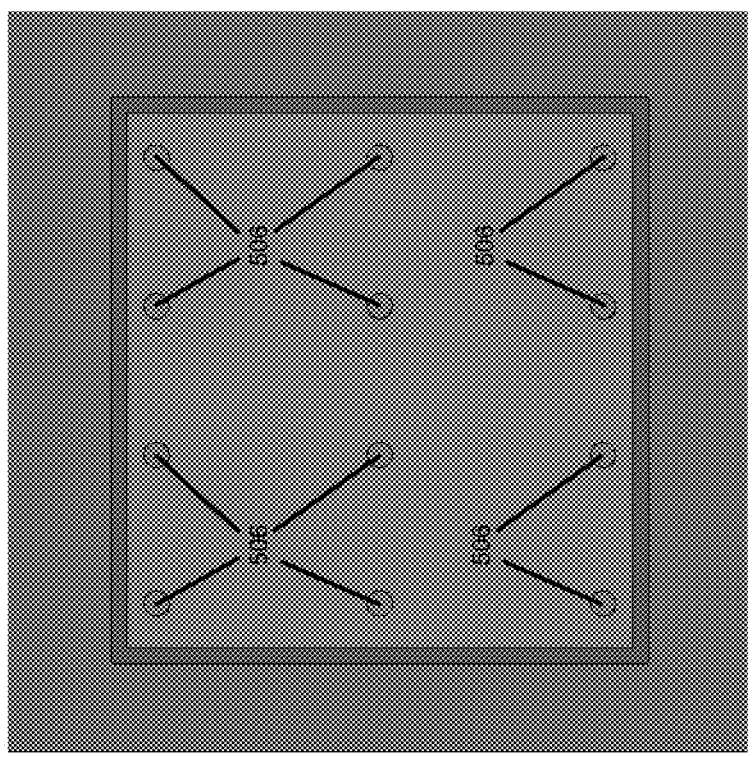
FIG. 5 illustrates a bottom view of a structure according to some embodiments of the inventions.

FIG. 5 illustrates a bottom view of a high impedance structure segment 500. In some embodiments, structure segment 500 is the same as or similar to structure segment 300 of FIG. 3 and/or structure segment 400 of FIG. 4. High impedance structure segment 500 illustrates a plurality of vias 506 that may be used to couple ground signals in an area near an ESD component in a manner that is the same as and/or similar to that of vias 242 of FIG. 2, 306 of FIG. 3, and/or 406 of FIG. 4.

Figure 6:
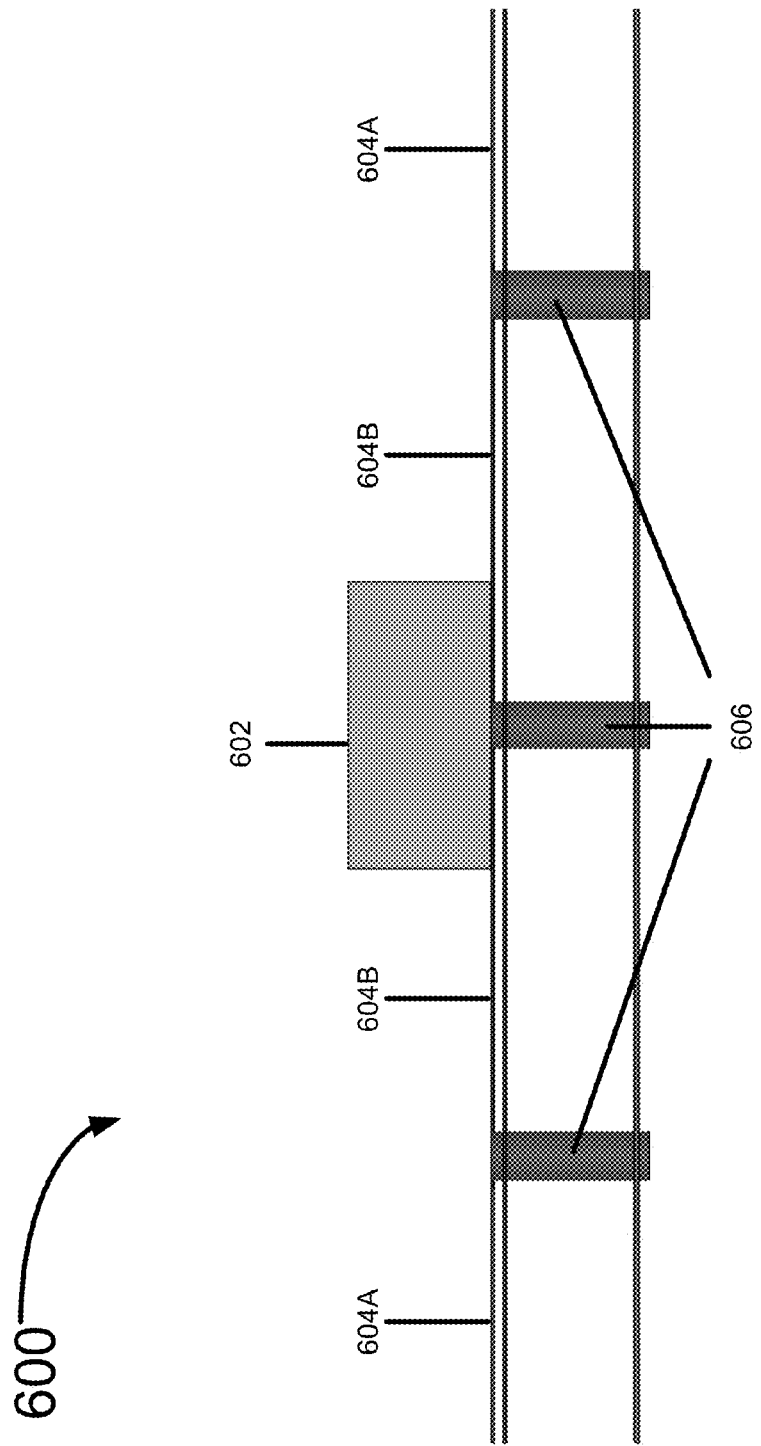
FIG. 6 illustrates a side view of a structure according to some embodiments of the inventions.

FIG. 6 illustrates a side view (for example, a right side view) of a high impedance structure segment 600. In some embodiments, structure segment 600 is the same as or similar to structure segment 300 of FIG. 3, structure segment 400 of FIG. 4, and/or structure segment 500 of FIG. 5. High impedance structure segment 600 illustrates an electrostatic discharge (ESD) component 602 for three different differential signal channels according to some embodiments. As illustrated in FIG. 6, structure segment 600 illustrates a differential signal line that includes an original intra-space differential signal 604A and a slightly increased intra-space differential signal 604B near the ESD component 602. High impedance structure segment 600 also illustrates according to some embodiments a plurality of vias 606 that may be used to couple ground signals in an area near the ESD component 602 in a manner that is the same as and/or similar to that of vias 242 of FIG. 2, 306 of FIG. 3, 406 of FIG. 4, and/or 506 of FIG. 5.

FIG. 7 illustrates a three dimensional view of a high impedance structure segment 700 according to some embodiments. High impedance structure segment 700 illustrates an electrostatic discharge (ESD) component 702 for three different differential signal channels 704 according to some embodiments. As illustrated in FIG. 7 each of the three differential signal channels 704 include in some embodiments original intra-space portions 704A and a slightly increased intra-space portion 704B near the ESD component 702. High impedance structure segment 700 of FIG. 7 also includes a plurality of vias 706 that may be used to couple ground signals in an area near the ESD component 702 in a manner that is the same as and/or similar to that of vias 242 of FIG. 2, 306 of FIG. 3, 406 of FIG. 4, 506 of FIG. 5, and/or 606 of FIG. 6. Although some of the vias 706 illustrated in FIG. 7 are underneath the ESD component 702 they are illustrated in FIG. 7.

FIG. 8 illustrates a three dimensional cutaway view of a high impedance structure segment 800 according to some embodiments. High impedance structure segment 800 illustrates an electrostatic discharge (ESD) component 802 for three different differential signal channels 804 according to some embodiments. As illustrated in FIG. 8 each of the three differential signal channels 804 include in some embodiments original intra-space portions 804A and a slightly increased intra-space portion 804B near the ESD component 802. High impedance structure segment 800 of FIG. 8 also includes a plurality of vias 806 that may be used to couple ground signals in an area near ESD component 802 in a manner similar to that of vias 242 of FIG. 2, 306 of FIG. 3, 406 of FIG. 4, 506 of FIG. 5, 606 of FIG. 6, and/or 706 of FIG. 7.

Figure 9:
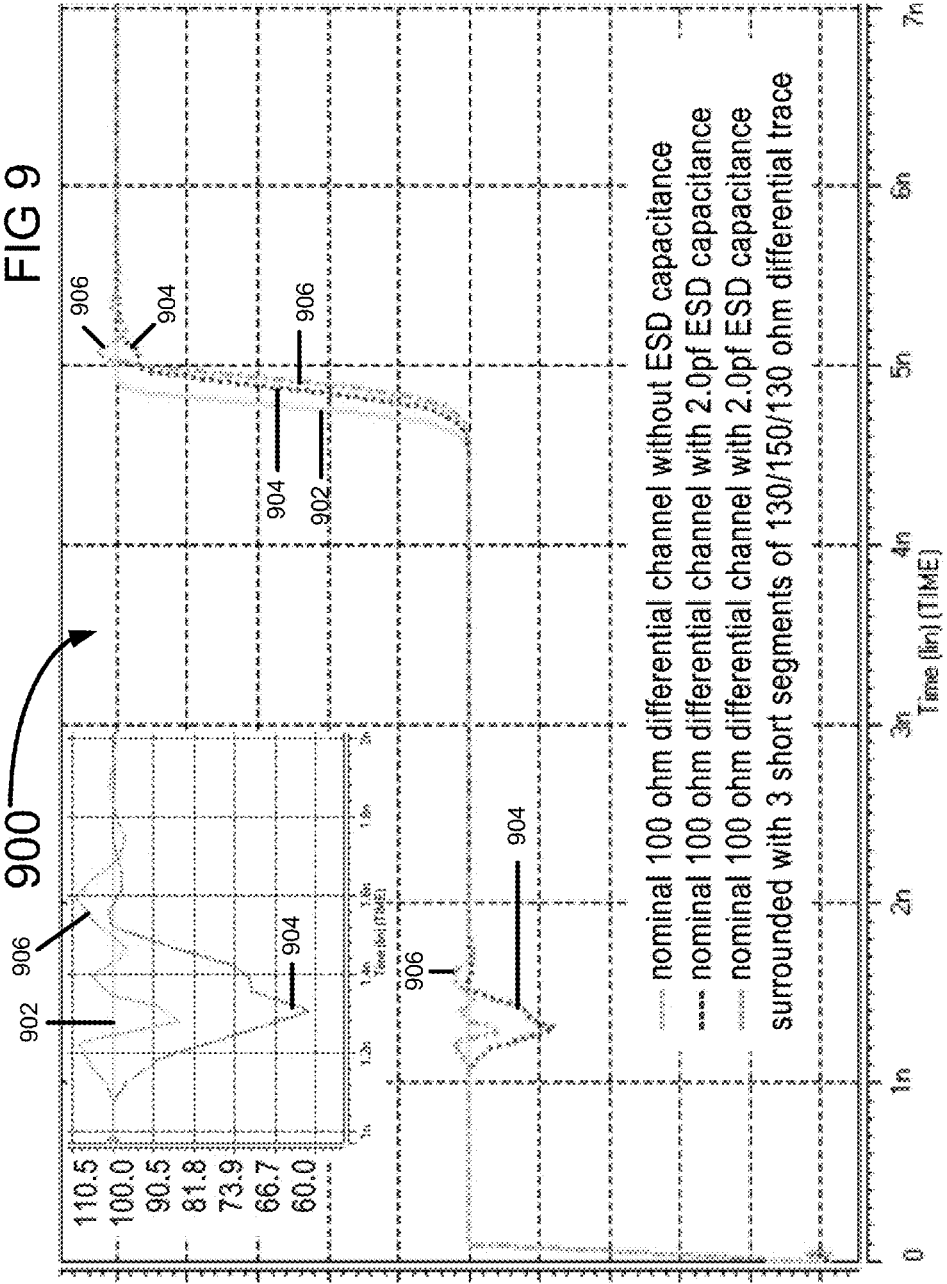
FIG. 9 illustrates a graph according to some embodiments of the inventions.

FIG. 9 illustrates a graph 900 according to some embodiments. According to some embodiments, a structure with three short segments of 130 ohm, 150 ohm and 130 ohm, respectively are used for a differential impedance paired transmission line routing around two pins linking an ESD component. An equivalent differential channel impedance is improved from approximately 66 ohms, which violates the high-speed differential channel nominal impedance value of 100 ohms within +/−15%, to between approximately 110 ohms and 85 ohms. As illustrated in FIG. 9, graph 900 shows time (in nanoseconds) on the horizontal axis and impedance (in ohms) on the vertical axis. Graph 900 includes a graph 900 which shows a first graph line 902 illustrating a nominal 100 ohm differential channel without any electrostatic discharge (ESD) capacitance, a second graph line 904 which shows a nominal 100 ohm differential channel with 2.0 pf ESD capacitance, and a third graph line with a nominal 100 ohm differential signal with 2.0 pf ESD capacitance surrounded by three short segments of 130 ohms/150 ohms/130 ohms differential trace impedances (for example, according to some embodiments). As illustrated by FIG. 9, graph 904 dips down to nearly 60 ohms around 1.3 ns, whereas the graph 906 (for example, according to some embodiments) stays within a range of approximately 85 ohms to 110 ohms, for example.

According to some embodiments, a typical high-speed video channel (for example, a four inch HDMI channel (between the chip and connector) running at 1080p 16 bits deep color mode will violate the eye pattern spec at the connector specified in the HDMI 1.3 spec, with an ESD component right before the connector. However, according to some embodiments, a higher impedance transmission line structure is applied before the connector to compensate for parasitic capacitance introduced by the ESD component. After applying the higher impedance compensation structure an eye pattern (for example, at 2.25 Gbps) is significantly improved from completely violating the spec to meeting the spec with a vertical Vmargin larger than 100 mV and a horizontal Tmargin of approximately 100 ps.

According to some embodiments, the implementations are applicable to any high speed channel which has an inevitable capacitance parasitic. According to some embodiments, the implementations are applicable to high speed digital video channels, HDMI, DisplayPort, and/or IEEE 1394.

According to some embodiments, the implementations are applicable to high speed channels running at any data rate. According to some embodiments, the higher the data rate the more benefit that the implementations achieve in performance improvement and/or cost reduction.

According to some embodiments, implementations are applicable to one high speed serially linking channel. According to some embodiments, implementations are applicable to multiple high speed serially linking channels.

According to some embodiments illustrated and described herein, a structure is used for higher than normal impedance based on a four layer stack-up. According to some embodiments, the geometry detailed herein may be dependent on a stack up for a particular platform. However, according to some embodiments, a technique for compensation for electrostatic discharge (ESD) capacitance load may be implemented according to many different geometries, stack-ups, etc. and is not limited to those described and illustrated herein.

Although some embodiments have been described herein as being implemented in a particular manner, according to some embodiments these particular implementations may not be required.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
   a differential communication channel to compensate for electrostatic discharge capacitance of an electrostatic discharge component; and
   a reference plane parallel to the differential communication channel, wherein the reference plane is trenched near the electrostatic discharge component to increase a differential impedance of the differential communication channel near the electrostatic discharge component.

2. The apparatus of claim 1, further comprising the electrostatic discharge component.

3. The apparatus of claim 1, wherein the reference plane of the differential communication channel includes is partially trenched near the electrostatic discharge component.

4. The apparatus of claim 1, wherein an intra-space of the differential communication channel is increased near the electrostatic discharge component.

5. A method comprising:
   compensating for electrostatic discharge capacitance of an electrostatic discharge component by trenching a reference ground plane underneath a differential communication channel to increase a differential impedance of the differential communication channel near the electrostatic discharge component.

6. The method of claim 5, wherein trenching a reference ground plane comprises partially trenching the reference ground plane near the electrostatic discharge component.

7. The method of claim 5, further comprising increasing an intra-space of the differential communication channel near the electrostatic discharge component.

8. The method of claim 5, wherein trenching the reference ground plane comprises trenching the reference ground plane underneath the differential communication channel in an area near the electrostatic discharge component.

9. An electronic device, comprising:
   a reference plane on an internal layer of a circuit board;
   a differential channel on a surface of the circuit board, the differential channel comprising a first signal line and a second signal line and running parallel to the reference plane;
   an electrostatic discharge component over the first signal line and the second signal line;
   wherein the reference plane is trenched in the area underneath the electrostatic discharge component.

10. The electronic device of claim 9, wherein the differential channel comprises a first section, a second section adjacent to the first section, and a third section adjacent to the second section, wherein:
    In the first section and the third section, intra-space of the differential communication channel is increased and the reference plane is not trenched; and
    In the second section, the intra-space of the differential communication channel is increased and the reference plane is trenched.

11. The electronic device of claim 9, wherein the trenched reference plane comprises a first reference plane disposed at a first layer of the circuit board and a second reference plane disposed at a second layer of the circuit board deeper than the first layer, Wherein both the first reference plane and the second reference plane are parallel to the first signal line and the second signal line.

12. The electronic device of claim 9, wherein the trenched reference plane comprises a gap in the first reference plane.

13. The electronic device of claim 9, wherein the size of the gap in the first reference plane determines a differential impedance of the differential communication channel.

* * * * *